(12) United States Patent
Park et al.

(10) Patent No.: US 7,116,411 B2
(45) Date of Patent: Oct. 3, 2006

(54) METHOD OF PERFORMING RESIST PROCESS CALIBRATION/OPTIMIZATION AND DOE OPTIMIZATION FOR PROVIDING OPE MATCHING BETWEEN DIFFERENT LITHOGRAPHY SYSTEMS

(75) Inventors: Sangbong Park, Fremont, CA (US); Jang Fung Chen, Cupertino, CA (US); Armin Liebchen, Hayward, CA (US)

(73) Assignee: ASML Masktools B.V., Veldhoven (NL)

( * ) Notice: Subject to any disclaimer, the term of this patent is extended or adjusted under 35 U.S.C. 154(b) by 98 days.

(21) Appl. No.: 10/926,400

(22) Filed: Aug. 26, 2004

(65) Prior Publication Data
US 2006/0044542 A1    Mar. 2, 2006

(51) Int. Cl.
- *G01B 9/00* (2006.01)
- *G03B 27/32* (2006.01)
- *G03C 5/00* (2006.01)

(52) U.S. Cl. .......................... 356/124; 355/77; 430/30

(58) Field of Classification Search ................. 355/77; 356/124, 138
See application file for complete search history.

(56) References Cited

U.S. PATENT DOCUMENTS

| 6,678,240 B1 * | 1/2004 | Geh et al. ..................... 355/77 |
| 6,781,682 B1 * | 8/2004 | Kasai et al. ................ 356/138 |

* cited by examiner

*Primary Examiner*—W. B. Perkey
*Assistant Examiner*—Vivian Nelson
(74) *Attorney, Agent, or Firm*—McDermott Will & Emery LLP

(57) ABSTRACT

A method of optimizing a process for use with a plurality of lithography systems. The method includes the steps of: (a) determining a calibrated resist model for a given process and a target pattern utilizing a first lithography system; (b) selecting a second lithography system to be utilized to image the target pattern utilizing the given process, the second lithography system capable of being configured with one of a plurality of diffractive optical elements, each of the plurality of diffractive optical elements having corresponding variable parameters for optimizing performance of the given diffractive optical element; (c) selecting one of the plurality of diffractive optical elements and simulating the imaging performance of the second lithography system utilizing the selected one of the plurality of diffractive optical elements, the calibrated resist model and the target pattern; and (d) optimizing the imaging performance of the selected one of the plurality of diffractive optical elements by executing a genetic algorithm which identifies the values of the parameters of the selected one of the plurality of diffractive optical elements that optimizes the imaging of the target pattern.

6 Claims, 6 Drawing Sheets

METHOD OF PERFORMING RESIST PROCESS CALIBRATION/OPTIMIZATION AND DOE OPTIMIZATION FOR PROVIDING OPE MATCHING BETWEEN DIFFERENT LITHOGRAPHY SYSTEMS

TECHNICAL FIELD

The technical field of the present invention relates generally to a method and program product for performing resist process calibration and optimization, and diffractive optical element (DOE) optimization so as to allow for matching of optical proximity effects (OPE) between different lithography systems.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

Another goal is to be able to utilize the same "process" for imaging a given pattern with different lithography systems (e.g., scanners) without having to expend considerable amounts of time and resources determining the necessary settings of each lithography system to achieve optimal/acceptable imaging performance. As is known, designers/engineers spend a considerable amount of time and money determining the optimal settings of a lithography system, which include numerical aperture (NA), $\sigma_{in}$, $\sigma_{out}$, etc., when initially setting up a given process to work with a particular scanner so that the resulting image satisfies the design requirements. Indeed, this is typically a trial and error process wherein the scanner settings are selected and the desired pattern is imaged and then measured to determine if the resulting image is within specified tolerances. If not, the scanner settings are adjusted and the pattern is imaged once again and measured. This process is repeated until the resulting image is within the specified tolerances.

Once this procedure is completed for a given system, it would be advantageous to allow the same process to be utilized on other types of scanners, for example, a different model scanner, or even the same model scanner, but a different machine from the one utilized to confirm the process, without having to perform the time consuming and expensive process of revising the process and optimization of the lithography system. This would allow for a significant time and cost savings as there would be no need for performing the trial and error process noted above.

However, as each scanner, even identical model types, exhibit different optical proximity effects (OPEs) when imaging a pattern, the actual pattern imaged on the substrate differs from scanner to scanner due to the different OPEs. For example, referring to FIG. 1, the different OPEs between scanners can introduce as much as a 10 nm CD variation through pitch. Referring to FIG. 1, the graphs represent the results of Scanner I and Scanner II imaging the same pattern. As is clear, the resulting CD measurements vary between the two scanners over pitch. As such, it is not possible to simply utilize either scanner to image a given pattern, as the resulting image can vary considerable.

Thus, if it is desirable to utilize a different scanner to print a given pattern, the engineers must optimize or tune the new scanner, which includes selecting the diffractive optical element (DOE) (e.g., annular, Quasar, quadrature, etc.) and adjusting the exposure conditions (e.g., NA, $\sigma_{in}$, $\sigma_{out}$, etc.) of the scanner, so that the resulting image satisfies the design requirements (e.g., critical dimension (CD), depth of focus (DOF), exposure latitude (EL), etc.). Currently, this is accomplished by a trial and error process, which as noted above, is both expensive and time consuming.

As such, there is a need for a method for optimizing a process for imaging a given pattern that allows the process to be utilized with different lithography systems that does not require a trial and error process to be performed to optimize the process and scanner settings for each individual scanner. In other words, there is a need for an optimization process that allows for the process engineer to utilize different lithography systems to image a given pattern without having to change or re-tune the process.

SUMMARY

Accordingly, the present invention relates to a method that allows different lithography systems to image a given target pattern utilizing a known process that does not require a trial and error process to be performed to optimize the process and lithography system settings for each individual lithography system.

More specifically, the present invention relates to a method of optimizing a process for use with a plurality of lithography systems. The method includes the steps of: (a) determining a calibrated resist model for a given process and a target pattern utilizing a first lithography system; (b) selecting a second lithography system to be utilized to image the target pattern utilizing the given process, the second lithography system capable of being configured with one of a plurality of diffractive optical elements, each of the plurality of diffractive optical elements having corresponding variable parameters for optimizing performance of the given diffractive optical element; (c) selecting one of the plurality of diffractive optical elements and simulating the imaging performance of the second lithography system utilizing the selected one of the plurality of diffractive optical elements, the calibrated resist model and the target pattern; and (d) optimizing the imaging performance of the selected one of the plurality of diffractive optical elements by executing a genetic algorithm which identifies the values of the parameters of the selected one of the plurality of diffractive optical elements that optimizes the imaging of the target pattern.

The present invention provides significant advantages over prior art methods. Most importantly, the present invention is very cost effective as it allows a process to be implemented on a different lithography system, without the need for performing an expensive and time consuming trial and error process to configure the different lithography system to allow printing of the target image.

Furthermore, the time required for configuring a lithography system to work with a given process utilizing prior art techniques was largely dependent on the experience and knowledge of the process engineer configuring the system. The method of the present invention minimizes the need for such knowledge on behalf of the process engineer, as the process is substantially automated, and allows for determination of optimal settings for the lithography system in a fast and efficient manner, and substantially automated manner, thereby eliminating the need for experienced process engineers.

Yet another advantage is that the method of the present invention allows for the use of various lithography systems to print a given target pattern and allows each lithographic system to be utilized under optimal operating conditions when imaging the target pattern.

Additional advantages of the present invention will become apparent to those skilled in the art from the following detailed description of exemplary embodiments of the present invention.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and U.S. Pat. No. 5,523,193, which are incorporated herein by reference.

a programmable LCD array. An example of such a construction is given in U.S. Pat. No. 5,229,872, which is incorporated herein by reference.

The invention itself, together with further objects and advantages, can be better understood by reference to the following detailed description and the accompanying schematic drawings.

DESCRIPTION

Figure 2:
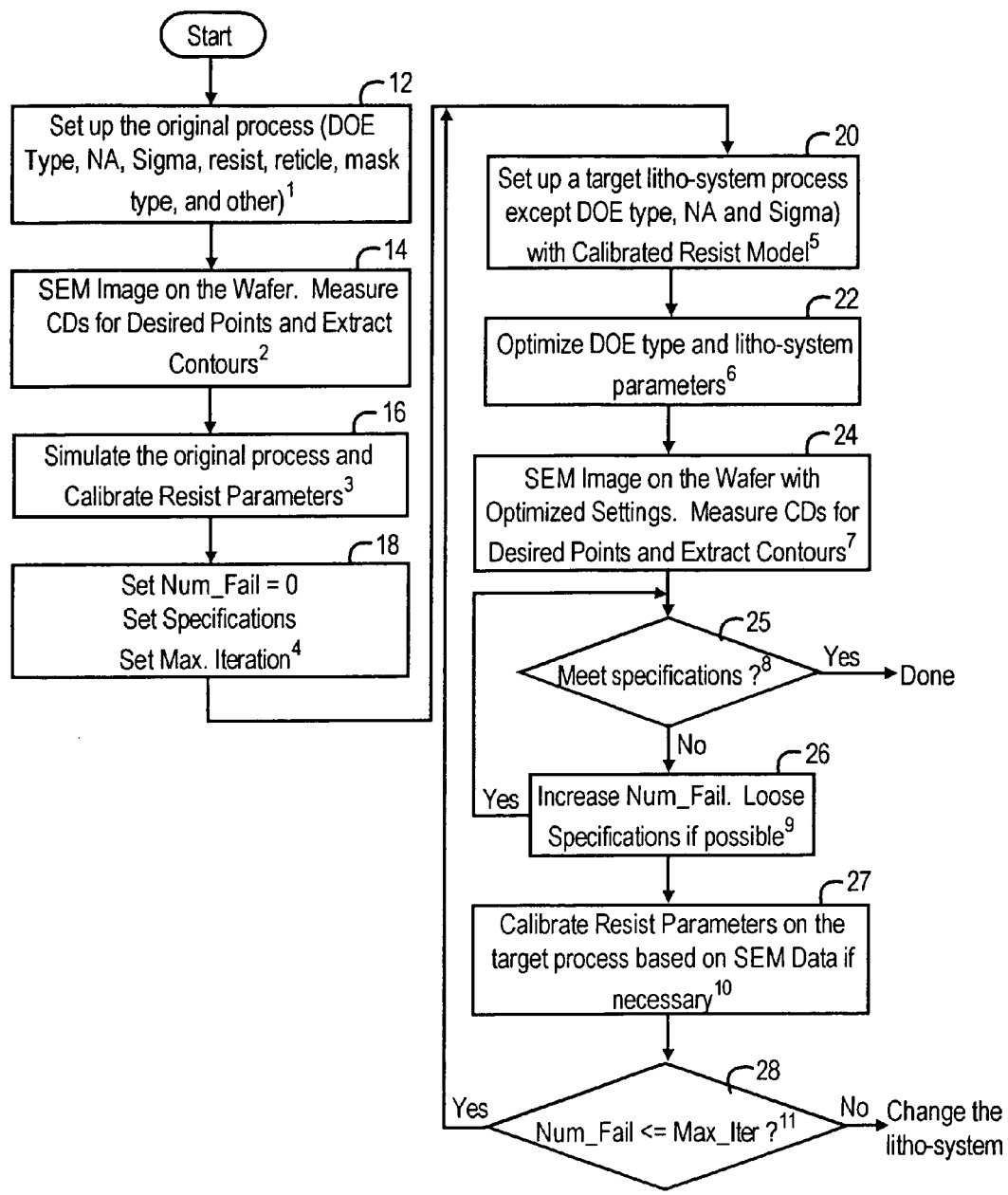
FIG. 2 is an exemplary flowchart illustrating the method of the present invention.

FIG. 2 is an exemplary flowchart illustrating the method of the present invention. As explained in detail below, the method of the present invention allows for simultaneous optimization of the resist process and DOE to provide OPE matching such that different lithography systems, including scanners, can be utilized to image the same pattern without having to re-tune or re-calibrate the process for each individual scanner.

The first stage of the process is to determine a resist model, which quantifies the performance of the resist. Any known resist model, such as Brunner-Fergusson, Lumped Parameter Model, etc., can be utilized.

More specifically, referring to FIG. 2, this entails (Step 12) identifying the target pattern to be imaged, selecting a given lithography system (i.e., Scanner I) to initially image the target pattern, and determining the process to be utilized to image the target pattern, which includes determining the DOE element, NA, $\sigma_{in}$, and $\sigma_{out}$ of the scanner that provides optimal imaging.

The next step (Step 14) in the process is to actually image the target pattern on a substrate utilizing Scanner I and the process conditions determined in Step 12, and then measure the resulting pattern. Measurement of the pattern imaged on the substrate can be performed by either measuring a predetermined number of CDs of the features at pre-specified locations, or by measuring the 2-dimensional contours of the features, or a combination of the two. Both of the foregoing measurements can be taken by means of a scanning electron microscope (SEM) or by any other suitable means.

Once the foregoing step is completed, the next step (Step 16) in the process is to simulate the imaging of the target pattern on a substrate utilizing a suitable simulation tool, such as, for example, LithoCruiser™ offered by ASML MaskTools, so as to allow for determination of an accurate resist model. The simulation must be run utilizing the same process and scanner settings utilized to actually image the pattern in Step 14.

Once the simulation is run, the results of the simulation are compared to the actual image of the pattern formed on the substrate to determine how closely the simulation result matches the actual result. A reiterative process is then performed in which the parameters associated with the resist model, which as noted above can be the Brunner-Fergusson model, are adjusted until the simulation results match the actual imaging results within some predefined tolerance. It is noted that numerous simulations may be executed during the process of minimizing the difference between the simulation result and the actual result, with the parameters of the resist model being varied each iteration. Once the result of the simulation result and the actual result match within a predefined tolerance, the resist model parameters associated with the most optimal match are recorded (of course, it is desirable to tune the resist model parameters so as to make the difference between the simulated result and the actual result as small as possible). The resist model and the recorded parameters represent the performance of the resist in the actual process, or in other words, a calibrated resist model.

As noted above, the comparison between the simulation results and the actual image can be based on a comparison of CD measurements taken along identical feature cross-sections of the simulation results and the actual image, or can be a comparison of the 2-dimensional contour image of the actual image, which can be produced utilizing a SEM, and the two dimensional contour image of the simulated result. It is further noted that the foregoing comparisons are performed utilizing any suitable data format, such as, for example, GDSII Stream™.

The calibrated resist model, which effectively represents the imaging performance of the resist and the target mask in the given process, serves as a starting point for selecting the appropriate DOE for use with a second lithography system (e.g., the second scanner) so as to allow for matching of the OPEs so as to minimize the degradation in printing performance and allow the process already optimized for use with the first scanner to be utilized with a second scanner.

In other words, once the calibrated resist model is determined in the manner set forth above, the calibrated resist model, which effectively represents the performance of the resist, target pattern and OPE associated with the first scanner, is utilized as a basis for determining the optimal DOE settings of a second scanner (i.e., different model or same model different machine) necessary to allow the second scanner to print the target image within acceptable design specifications utilizing the same process as utilized to print the target image with the first scanner. As will be explained, the determination of the optimal DOE for the second scanner is also an iterative process. However, as opposed to prior art techniques, the method of the present invention is not a random trial and error process. In contrast, the present invention provides a more efficient and faster method for optimizing the illumination element of the second scanner (it is noted that the second scanner referred to herein is intended to refer to any scanner other than the scanner utilized to determine the calibrated resist model).

Referring again to FIG. 2, the next step (Step 18) in the process is to identify how many iterations of the DOE selection process will be performed before it is concluded that no acceptable DOE for the second scanner can be identified. In this regard, it is noted that it is a possibility that no solution exists for a given scanner utilizing the calibrated resist process. In such instances, as detailed below, the resist model can be recalibrated or a different scanner (i.e., lithography system) can be utilized.

In addition, the criteria or specifications for determining whether or not the resulting image produced by the second scanner is within acceptable limits are specified and input into the simulator in Step 18. More specifically, the designer/process engineer identifies which design criteria will be utilized to determine if the second scanner produces an acceptable result. One or more specific criteria may be utilized. Such design criteria include, but are not limited to, critical dimension, depth of focus, exposure latitude, process window, etc.

The next step (Step 20) in the process is to setup the target lithographic system (i.e., the second scanner which is be tuned to implement the process performed by the first scanner) also referred to as the simulation environment. This step entails inputting the target pattern to be simulated, which is identical to the target pattern utilized to model the resist, as well as any other processing conditions that were utilized in the process of modeling the resist.

In other words, the conditions (i.e., simulation variables) utilized to run the simulation for optimizing the DOE of the second scanner are made as identical as possible to the conditions utilized in the resist modeling process. For example, such conditions include, but are not limited to, lens aberrations, polarization, immersion condition, or any other machine specific conditions. In addition, the calibrated resist model determined in Step 16 is input into the simulator as the model will be utilized in the simulation process. It is noted that the DOE element and corresponding exposure conditions (e.g., NA, $\sigma_{in}$, $\sigma_{out}$) are not input as fixed variables of the simulation process, as it is these elements of the second scanner that the method of the present invention functions to optimize.

Figure 3:
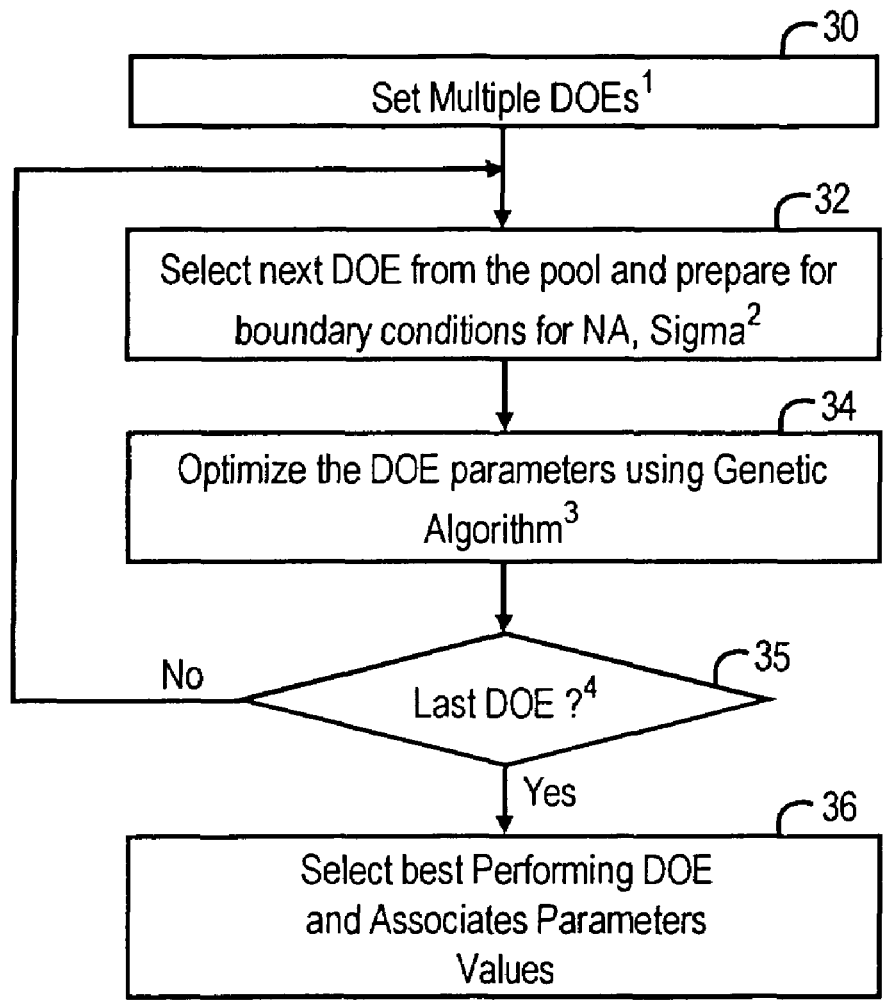
FIG. 3 is an exemplary flowchart illustrating the multiple DOE optimization process of the present invention.

Next (Step 22), the DOE element of the second scanner that optimizes the imaging results of the desired process and target pattern is determined. As noted above, the DOE element is optimized for the process conditions and resist model input into the simulator in Step 20. FIG. 3 illustrates an exemplary process of selecting the optimal DOE element and exposure conditions in accordance with the present invention. Referring to FIG. 3, the first step (Step 30) is to identify all of the DOE elements (e.g., quadrature, Quasar™, dipole, annular, etc.) available for the scanner under consideration. In the next step (Step 32), one of the DOE elements is selected for consideration and the associated boundary conditions of the DOE under consideration are provided to the simulator. It is noted that the boundary conditions such as the NA, and $\sigma_{in}$ and $\sigma_{out}$ for a given NA are typically provided by the manufacture of the scanner. As is known, the range of NA is determined by the lithography system being utilized, and is specified by the manufacturer, and the values of $\sigma_{in}$ and $\sigma_{out}$ are based on the value of the NA.

In the next step (Step 34), the optimal parameters for the given DOE under consideration for producing an image which most closely matches the target pattern are determined utilizing a genetic algorithm (i.e., artificial intelligence algorithm). More specifically, the genetic algorithm, which is implemented and executed by the simulator, operates to determine the specific values of the variable parameters of the given DOE under consideration that produces an image that most closely corresponds to the target pattern. It is noted that in the simulation process, the specifications set in Step 18 are utilized by the simulator as the criteria to determine whether or not the DOE and currently selected parameters satisfy the design requirements. The value of the variable parameters for a given DOE element that best satisfy the specifications (i.e., most closely matches the target design) are selected as the optimal solution for the given DOE element.

Once the optimal parameters are determined for the first DOE in Step 34 (these optimal parameters for the first DOE are recorded and stored in memory), the process proceeds to Step 35 where it is determined if there are any additional DOEs that have not been subjected to the optimization process of Step 34. If DOEs remain to be optimized, the process proceeds back to Step 32 where the next DOE is selected and Steps 34 and 35 are repeated for the next DOE.

Once the last DOE is optimized, the process proceeds to Step 36 where all of the DOEs just analyzed and optimized are compared to one another to determine which DOE provides the best results (i.e., most closely matches the target pattern). This can be determined by comparing the results of each of the DOEs and determining which DOE was the farthest below the minimum design requirements defined by the specifications set in Step 18. The DOE element selected after this process represents the DOE element for the second scanner that will provide the best imaging performance (i.e., produce an image that most closely matches the target pattern).

Figure 1:
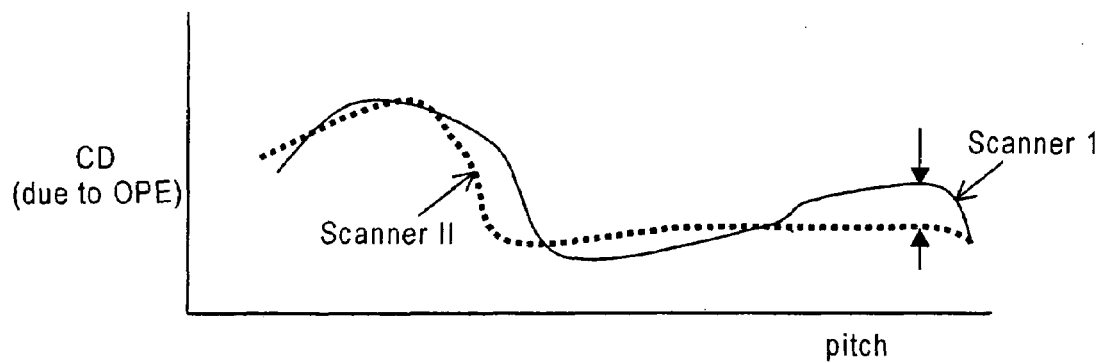
FIG. 1 illustrates an example of the possible differences in imaging performance due to OPE when utilizing two different scanners to image the same target pattern.

Once the optimal DOE is selected, the process returns to Step 24 as shown in FIG. 1, in which the optimal DOE element is utilized to actually image the target pattern on a substrate utilizing the second scanner. It is noted that all other process conditions are the same as those utilized to generate the calibrated resist model when initially imaging the target pattern with the first scanner in Step 14. A SEM image of the resulting image is then taken, and a comparison is made between the resulting image produced by the second scanner utilizing the optimized DOE element and the pre-defined specifications in Step 25. As noted above, the comparison can be made based on predefined cut lines (i.e., CD measurements) or by a comparison of 2 dimensional contours of the features extracted from the SEM image. Of course, it is possible to use only a portion of the overall pattern when performing the comparison.

If the resulting image satisfies the design specifications, the process is complete, and the optimized DOE is utilized in the second scanner. However, if the resulting image does not satisfy design specifications, the process proceeds to Step 26 wherein it is determined whether or not it is possible to increase the error tolerances of the design specifications (i.e., loosen design requirements). For example, it is possible to automatically adjust the tolerances by utilizing the formula New_Tolerance=Old_Tolerance×(1+factor), (e.g., factor=10%). If so, the error tolerances are increased and the resulting image produced by the second scanner is re-compared against the less strict design requirements by returning to Step 25. If the resulting image satisfies the less strict design requirements, the process is complete.

However, if it is not possible to loosen the design requirements, or the resulting image still fails to satisfy the less strict design requirements, the process proceeds to Step 27, in which a new calibrated resist model (to be utilized in the simulation) is determined utilizing the second scanner. The new resist model is generated in the same manner as the first resist model discussed above in Steps 12–16, with the exception being that the image of the target pattern produced by the second scanner is utilized in the comparison process when determining the resist model parameters.

Once the new calibrated resist model is generated, the process proceeds to Step 28, where it is determined whether or not the maximum number of iterations has been exceeded. If not, the process proceeds back to Step 20, and Steps 20–27 are performed again utilizing the new calibrated resist model. If the maximum number of iterations has been reached, then there is no acceptable solution utilizing the second scanner and a new lithography system must be utilized. In a typically application only two iterations would be utilized.

With regard to the genetic algorithm utilized in Step 34, as background information, genetic algorithms (or genetic optimizer) are premised on the basic concepts from the process of biological evolution. Three main types of such algorithms are genetic algorithms (GAs) proposed by Holland, evolutionary programming (EP) proposed by Fogel, and evolutionary strategies (ES) proposed by Rechenberg and Schwefel. Genetic algorithms abstract the basic principles of replication (reproduction), variation (mutation), and selection from evolutionary theories. The algorithms are distinguished by their reliance on the population of candidate solutions which spread widely over a search space. Compared with most classical methods of deterministic optimization that generate a sequence of solutions based on the gradient or higher-order statistics of the cost function, genetic algorithms perform complex nonlinear optimization with/without knowledge of gradient or higher-order statistics information.

Figure 4:
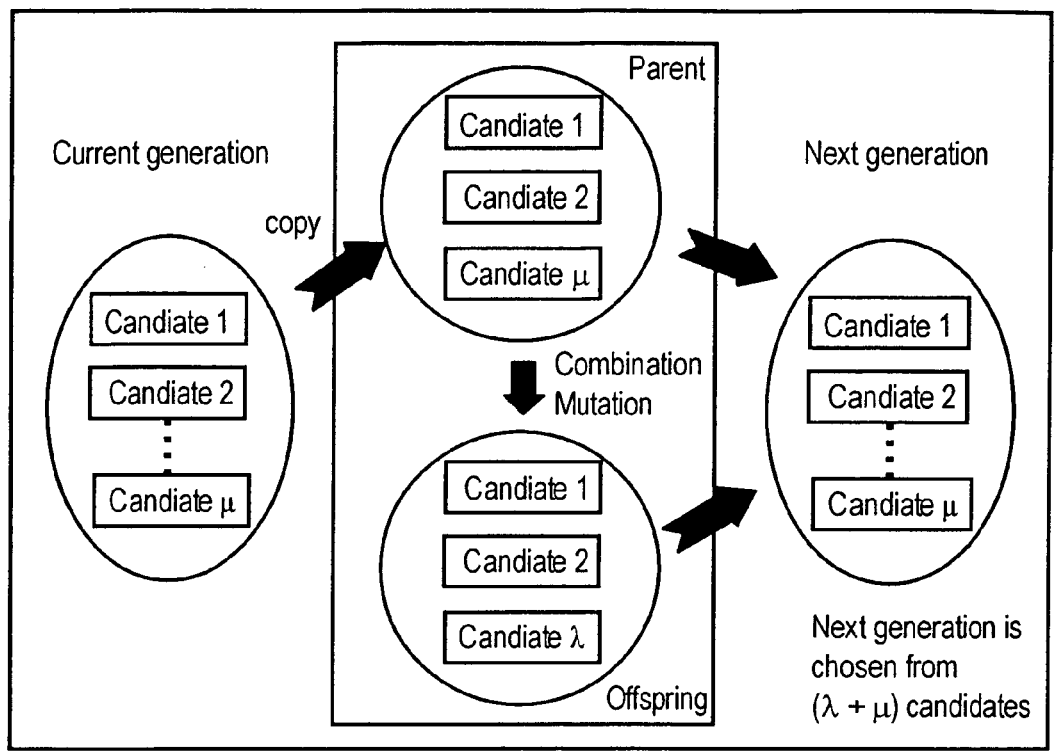
FIG. 4 illustrates a general block diagram describing the operation of a genetic algorithm.

FIG. 4 illustrates a general block diagram describing the operation of a genetic algorithm. The main principle involved with the use of the genetic algorithm is to evolve a pool of the solution candidates (called a population). As is known, a solution candidate is called a chromosome. The current generation of solution candidates is same as a pool of the solution candidates that is generated from the old population. The next generation is generated from the parent and the offspring group. The current generation becomes the parent. The offspring is a group of the solution candidates with a size of $\lambda$ generated by the mutation or recombination of randomly selected solution candidates from the parent group. From the ($\mu+\lambda$) solution candidates (parent+offspring), a new generation of solution candidates with a size of $\lambda$ is generated.

The population is a pool of the solution candidates with a size of $\mu$. Each solution candidate ($s_i \in \Omega$, i=1, ..., $\mu$) is encoded in the solution space ($\Omega$). Letting S(t)={$s_1^t$, $s_2^t$, ..., $s_\mu^t$} be the $\mu$ solution candidates in the population at the generation t, and f: $\Omega \mapsto R$ the real-valued cost function (i.e cost_value=f($s_i$), where i=1, ..., $\mu$), a pool of the solution candidates, S(0), is generated. Each candidate is then evaluated with the given cost metric function, and then the following procedures are repeated until the given stop criteria is satisfied:

1. Copy the current pool to the parent group, S'(t).
2. Make $\lambda$ offspring, S"(t):
   a. Select $\eta$ solution candidates from the parent group, S'(t) (selection for the reproduction)
   b. Select two candidates from the $\eta$ solution candidates.
   c. Generate new candidates by mutating or recombining two candidates, and add the new candidates to S"(t).
3. Evaluate S"(t), and
4. Generate S(t+1) from S'(t) and S"(t) (selection for the replacement).

Table I illustrates exemplary basic recombination and mutation operators utilized in the genetic algorithm. The recombination and mutation operators are used to generate new candidate(s) from the existing the solution candidate(s). Each solution candidate is an array of genes. A gene is an array of data. Thee operators vary the genes in the solution candidate and improve the capability to find the optimum.

Table I shows an example in which the solution candidate is binary encoded. So a gene can be represented as (0110). A solution candidate can be represented as:

(0110010111), where 0110 (gene1), 010 (gene2), and 111 (gene3).

Another solution candidate may appear as: (1110001010).

The recombination operator functions to switch the genes between the candidates. Switching two chromosomes at the certain point produces two new chromosomes.

(01100 10111) => (01100 01010)
(11100 01010) => (11100 10111)

The mutation operator functions to mutate certain genes in the solution candidate. (01100 10111)=>(0110110111)

TABLE I

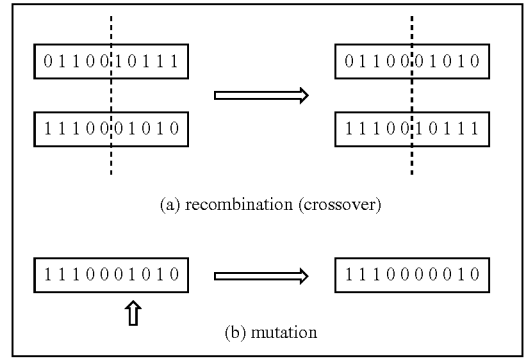

(a) recombination (crossover)

(b) mutation

It is noted that generated offspring chromosomes have new genes whose values are varied around their parents. For real coded-parameters, each chromosome and mutational variances are evolved as follows.

$$\sigma_i^{n+1} = \sigma_i^n + N(0, \epsilon\sigma_i^n)$$

$$s_i^{n+1} = s_i^n + N(0, \sigma_i^n)$$

where N(0,1) denotes normal distribution with zero mean and variance of 1.

The selection scheme plays an important role in improving the average quality and the diversity of the population. If each solution candidate is saturated too early (i.e., all solution candidates are the same), the population is prematured and the final solution may not be optimal. The selection scheme is applied when the parent group is generated (selection for the reproduction) or the next generation is selected from the parents and/or offspring (selection for the replacement). Techniques often utilized in selection schemes are described below.

A. Proportional selection: select the parents of the next generation from the current generation with the probability of:

$$p(s_i^t) = \frac{f(s_i^t)}{\sum f(s_i^t)}$$

where $f(s_i^t)$ is said to the cost metric value of i-th solution candidate ($s_i$) in the population at the generation t. $\Sigma f(s_i^t)$ is the summation of the cost metric values of the solution candidates in the population (the higher the cost metric value of the solution candidate is, the higher chances the solution candidate has to be selected as the parent in the next generation).

B. ($\mu+\lambda$) selection: $\mu$ parents are used to create $\lambda$ offspring, and all ($\mu+\lambda$) solutions are compared in terms of cost metric value and the best $\mu$ solutions are selected as parents of the next generation C. (μ,λ) selection: only λ offspring compete for survival, and the parents are completely replaced each generation.

D. q-tournament selection: select μ solution candidates from the union of parents and offspring. In principle, for each s $s_i^t \in S(t) \cup S''(t)$, a score $w_i$, i=1,2, . . . , μ+λ is calculated through competition against q solution candidates that are chosen at random from the union, $$w_i = \sum_{j=1}^{q} \begin{cases} 1 & C(s_i) \le C(s_{N_j}) \\ 0 & \text{otherwise} \end{cases}$$

where $N_j \in \{1,2, \ldots, \mu+\lambda\}$ is a uniform random variable, sampled anew for each comparison.

Figure 5:
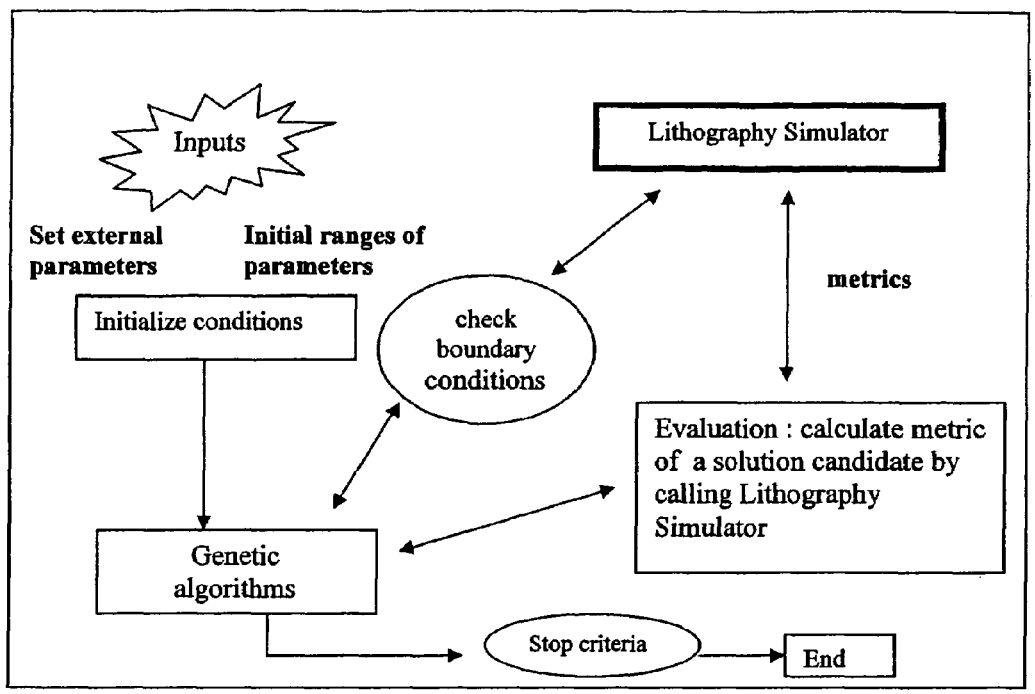
FIG. 5 is an exemplary block diagram illustrating the genetic algorithm utilized in conjunction with the present invention.

FIG. 5 is an exemplary block diagram illustrating the use of a genetic algorithm in conjunction with the present invention. More specifically, FIG. 5 illustrates how the algorithm is utilized in conjunction with the lithography simulator (e.g., such as the simulation tools offer for sale by ASML Masktools, Inc.). From FIG. 4, it is shown that the genetic algorithm requires a cost metric function to evaluate the solution candidate, and the solution candidate should meet the boundary conditions in the lithography simulator. The boundary conditions and the cost metric function are given through the interface between the lithography simulator and the genetic algorithm. It is noted that in a typical application, the computer system executing the simulation program would also be executing the genetic algorithm. Referring to FIG. 5, in general, the process is as follows:

Step 1—the user sets simulation conditions as initial ranges of parameters, input parameters, or others.

Step 2—the genetic algorithm creates an initial pool of solution candidates based on the user-defined conditions, and the genetic algorithm passes the user-defined simulation conditions to the simulator.

Step 3—the genetic algorithm requests the lithography simulator to evaluate each solution candidate.

Step 4—the lithography simulator checks internal boundary conditions and also returns an evaluated cost metric value.

Step 5—the genetic algorithm generates a new pool of the solution candidates based on the internal selection scheme and mutation/recombination operators.

Step 6—repeat C-F until the stop criteria meets (i.e., an acceptable solution has been identified, or it has been determined that no acceptable solution exists).

As noted above, the present invention provides significant advantages over prior art methods. Most importantly, the present invention is very cost effective as it allows a process to be implemented on a different lithography device, without the need for performing an expensive and time consuming trial and error process to configure the different lithography device to allow printing of the target image.

Furthermore, the time required for configuring a lithography device to work with a given process utilizing prior art techniques was largely dependent on the experience and knowledge of the process engineer configuring the machine. The method of the present invention minimizes the need for such knowledge on behalf of the process engineer, as the process is substantially automated, and allows for determination of optimal settings for the lithography machine in a fast and efficient manner and substantially automated manner, thereby eliminating the need for experienced process engineers.

Yet another advantage is that the method of the present invention allows for the use of various scanners and allows for the scanners to be utilized under optimal operating conditions.

Figure 6:
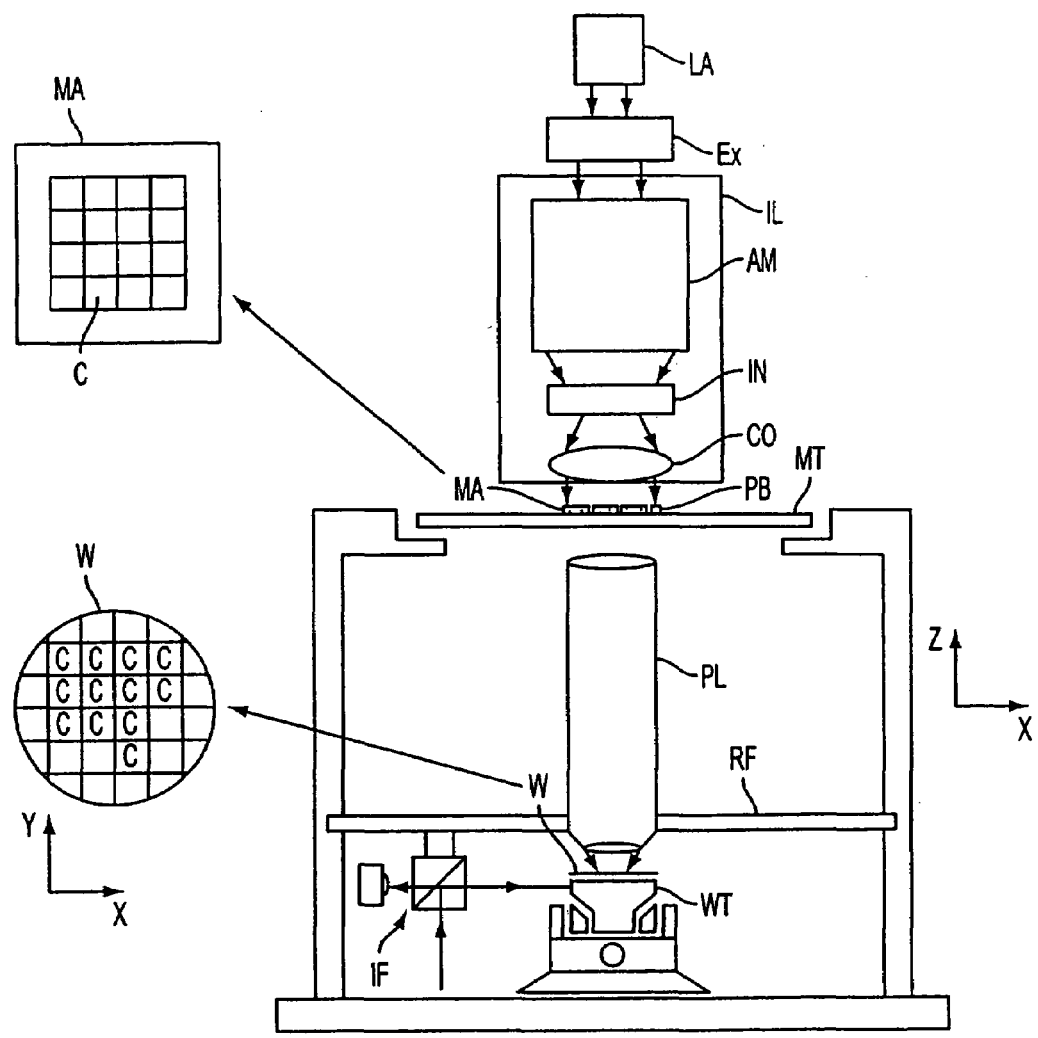
FIG. 6 schematically depicts a lithographic projection apparatus suitable for use with the method of the present invention.

FIG. 6 schematically depicts a lithographic projection apparatus suitable for use with a mask designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 6 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 6. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20–5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Software functionalities of a computer system involve programming, including executable code, are used to implement the above described method of determining optimal DOE for different lithography systems. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of optimizing a process for use with a plurality of lithography system, said method comprising the steps of:
   (a) determining a calibrated resist model for a given process and a target pattern utilizing a first lithography system;
   (b) selecting a second lithography system to be utilized to image said target pattern utilizing said given process, said second lithography system capable of being configured with one of a plurality of diffractive optical elements, each of said plurality of diffractive optical elements having corresponding variable parameters for optimizing performance of the given diffractive optical element;
   (c) selecting one of said plurality of diffractive optical elements and simulating the imaging performance of said second lithography system utilizing said selected one of said plurality of diffractive optical elements, said calibrated resist model and said target pattern; and
   (d) optimizing the imaging performance of said selected one of said plurality of diffractive optical elements by executing a genetic algorithm which identifies the values of the parameters of the selected one of the plurality of diffractive optical elements that optimizes the imaging of the target pattern.

2. The method of claim 1, further comprising the step of:
   repeating step (c) and step (d) for each of said plurality of diffractive optical elements;
   storing, in memory, the parameter values associated with each of the plurality of diffractive optical elements which correspond to the optimal imaging performance for the given diffractive optical element; and comparing the optimal imaging performance for each of the plurality of diffractive optical elements and selecting the diffractive optical element having the best imaging performance as the diffractive optical element to be utilized in said second lithography system.

3. The method of claim 1, wherein both said first lithography system and said second lithography system include a scanner.

4. A computer program product, comprising executable code transportable by at least one machine readable medium, wherein execution of the code by at least one programmable computer causes the at least one programmable computer to perform a sequence of steps for optimizing a process for use with a plurality of lithography systems, said sequence of steps comprising:
 (a) determining a calibrated resist model for a given process and a target pattern utilizing a first lithography system;
 (b) selecting a second lithography system to be utilized to image said target pattern utilizing said given process, said second lithography system capable of being configured with one of a plurality of diffractive optical elements, each of said plurality of diffractive optical elements having corresponding variable parameters for optimizing performance of the given diffractive optical element;
 (c) selecting one of said plurality of diffractive optical elements and simulating the imaging performance of said second lithography system utilizing said selected one of said plurality of diffractive optical elements, said calibrated resist model and said target pattern; and
 (d) optimizing the imaging performance of said selected one of said plurality of diffractive optical elements by executing a genetic algorithm which identifies the values of the parameters of the selected one of the plurality of diffractive optical elements that optimizes the imaging of the target pattern.

5. The program product of claim 4, further comprising the step of:
 repeating step (c) and step (d) for each of said plurality of diffractive optical elements;
 storing, in memory, the parameter values associated with each of the plurality of diffractive optical elements which correspond to the optimal imaging performance for the given diffractive optical element; and
 comparing the optimal imaging performance for each of the plurality of diffractive optical elements and selecting the diffractive optical element having the best imaging performance as the diffractive optical element to be utilized in said second lithography system.

6. The program product of claim 4, wherein both said first lithography system and said second lithography system include a scanner.

* * * * *